United States Patent [19]
Hughey et al.

[11] Patent Number: 5,469,364
[45] Date of Patent: Nov. 21, 1995

[54] APPARATUS AND METHODS FOR MEASURING AND DETECTING VARIATIONS IN THE VALUE OF A CAPACITOR

[76] Inventors: Bradley W. Hughey, 678 Schooner La., Elk Grove Village, Ill. 60007; Lucretiu Pisau, 4211 N. Keystone #1W; Liviu Millea, 4207 N. Keystone #B, both of Chicago, Ill. 60641

[21] Appl. No.: 31,809

[22] Filed: Mar. 15, 1993

[51] Int. Cl.$^6$ .................................................. G01R 27/26
[52] U.S. Cl. .......................... 364/482; 324/676; 324/677
[58] Field of Search ................................ 364/482, 483; 324/677, 678, 676; 178/17 C; 340/501; 200/600

[56] References Cited

U.S. PATENT DOCUMENTS

| | | | |
|---|---|---|---|
| 3,453,535 | 7/1969 | Anglin | 324/677 |
| 3,723,885 | 3/1993 | Urmentyl | 328/5 |
| 3,811,051 | 5/1974 | Merrell | 307/118 |
| 3,986,108 | 10/1976 | Thomas | 324/676 |
| 4,039,940 | 8/1977 | Butler et al. . | |
| 4,055,129 | 10/1977 | Hunts et al. | 112/158 E |
| 4,145,748 | 3/1979 | Eichelberger et al. . | |
| 4,157,539 | 6/1979 | Hunts et al. . | |
| 4,183,087 | 1/1980 | Huelsman | 364/515 |
| 4,234,871 | 11/1980 | Guglielmi et al. . | |
| 4,237,421 | 12/1980 | Waldron | 328/5 |
| 4,283,676 | 8/1981 | Shaw | 324/676 |
| 4,290,052 | 9/1981 | Eichelberger et al. | 340/365 |
| 4,363,029 | 12/1982 | Piliavin et al. | 340/501 |
| 4,458,196 | 7/1984 | Goyal et al. | 324/676 |
| 4,501,124 | 2/1985 | Hollaway . | |
| 4,502,042 | 2/1985 | Mulheim et al. | 340/568 |
| 4,567,470 | 1/1986 | Yoshikawa et al. . | |
| 4,587,620 | 5/1986 | Niimi et al. | 364/574 |
| 4,644,298 | 2/1987 | Kamiya et al. | 331/65 |
| 4,651,133 | 3/1987 | Ganesan et al. | 340/365 |
| 4,694,402 | 9/1987 | McEachern et al. | 364/487 |
| 4,733,222 | 5/1988 | Evans . | |
| 4,760,326 | 7/1988 | Bird | 324/61 P |
| 4,760,490 | 7/1988 | Murao | 361/181 |
| 4,772,874 | 9/1988 | Hasegawa . | |
| 4,799,165 | 1/1989 | Hollister et al. | 364/487 |
| 4,812,996 | 3/1989 | Stubbs | 364/487 |
| 4,820,971 | 4/1989 | Ko et al. | 324/678 |
| 4,908,622 | 3/1990 | Turai | 341/122 |
| 4,924,222 | 5/1990 | Antikidis et al. . | |
| 4,926,361 | 5/1990 | Ohtsubo et al. | 364/874 |
| 4,951,236 | 8/1990 | Kawate et al. | 360/283.1 |
| 4,954,823 | 9/1990 | Binstead | 341/26 |
| 4,985,844 | 1/1991 | Foley et al. | 364/487 |
| 5,016,008 | 5/1991 | Gruaz et al. . | |
| 5,019,995 | 5/1991 | Saito et al. | 364/483 |
| 5,036,320 | 7/1991 | Wroblewski . | |

(List continued on next page.)

FOREIGN PATENT DOCUMENTS 0110961  9/1980  Japan ..................................... 324/676

OTHER PUBLICATIONS

Simon Loe, "Contactless Keyboard Boosts Sensitivity," Electronic Engineering Times, May, 1992, Issue 691.

*Primary Examiner*—Ellis B. Ramirez
*Attorney, Agent, or Firm*—Lockwood, Alex, Fitzgibbon & Cummings

[57] ABSTRACT

A new and improved method for measuring the value of a capacitor and for detecting small variations in the value of a capacitor around a reference value is described. In accordance with the invention, the capacitance of capacitor may be determined by applying a voltage input having a known amplitude and wave form V to an RC circuit having a substantially known or constant load impedance R and sampling the voltage across the resistor or capacitor at a precisely controlled elapsed time interval T. The method now permits improved detector circuits to be created for measuring small variations in value with precision and accuracy. Solid state keypads incorporating sensor cells and software algorithms provide superior human to machine interface systems which are not subject to environmentally induced errors or errors due to component aging.

50 Claims, 5 Drawing Sheets

U.S. PATENT DOCUMENTS

| | | | |
|---|---|---|---|
| 5,036,321 | 7/1991 | Leach et al. | |
| 5,043,927 | 8/1991 | Jackson | 364/551.01 |
| 5,065,334 | 11/1991 | Taylor et al. | 364/485 |
| 5,081,406 | 1/1992 | Hughes et al. | 318/478 |
| 5,123,034 | 6/1992 | Grujon | 377/19 |
| 5,136,251 | 8/1992 | George et al. | 324/677 |
| 5,245,873 | 9/1993 | Fathauer et al. | 73/304 |
| 5,276,629 | 1/1994 | Reynolds | 364/487 |
| 5,294,889 | 3/1994 | Heep et al. | 324/678 |

LEAD TO AMPLIFIER    COMMON LEAD TO STEP GENERATOR

APPARATUS AND METHODS FOR MEASURING AND DETECTING VARIATIONS IN THE VALUE OF A CAPACITOR

BACKGROUND OF THE INVENTION

The present invention generally relates to methods and devices for measuring the value of a capacitive element, and especially to detecting small variations in the value of a capacitor about a reference value. More particularly, it relates to a new and improved single step method for directly sampling a capacitor to measure its value, to new and improved detector circuits for performing the measurement, and to new and improved methods in which successive measurements are taken over time and in which trends in the variations of the sample values are identified, analyzed and used to formulate command signals or decisions for a wide variety of end uses. In accordance with one preferred embodiment, the present invention provides a new and improved environmentally sealed, no-touch-required, solid state keypad device for providing a new and improved human-to-machine control command input interface adapted for a large number of specific industrial and commercial applications.

There are many different and well known and documented methods of capacitance measurement. Illustrative examples include bridging methods, which are based on comparing the value of the capacitor in AC permanent regime with the value of a reference impedance. There are many variations of the bridge circuit used to measure capacitors, the best known ones are Sauty, Wien, Nernst, and Schering. Resonance methods are also employed in measuring small capacitors by working in AC permanent regime and applying a tuned circuits theory to derive the unknown value of the capacitor.

Indirect prior art methods have been based on including the capacitor under test in a reaction loop of an oscillator and measuring the resulting frequency shift. Moreover, prior methods have also included introducing the capacitor under test in an active filter configuration and measuring the transfer characteristic of the circuit. Other direct methods have included DC methods based on charging/discharging a capacitor under test with a precisely controlled constant current source, thereafter measuring either the voltage across the capacitor after a specified amount of time, or measuring the necessary time required to reach a specified voltage.

Direct methods have included AC methods which measure directly the reactance of the capacitor under test using AC generators and AC voltmeters or amperemeters and apply a generalized Ohm's law.

Small variations in the value of capacitor, however, are difficult to measure using traditional techniques. There are many applications where knowing the exact value of a capacitor is less important than quantifying its relative variance over time. General purpose measurements in prior devices, such as capacimeters having a resolution of 1% or better, are slow and relatively expensive.

Aside from the need in certain applications for measuring the value of an unknown capacitance solely for the determination of its value in Farads, it is often advantageous to utilize capacitance as a parameter in the determination or variation of another variable. For example, a change in capacitance may readily be utilized as a method for entering data into a system, for example.

In this regard, the idea of a capacitive keyboard is not new. There have been many attempts in the prior art to introduce the benefits of a solid state keyboard with no moving parts into the marketplace. These benefits include aesthetics, i.e., the keys can work from behind a front panel of the device so that the keyboard blends into the surface, ruggedness, resistance to shock, and long service life. A rather basic and increasingly important example of this type of data entry is found in the use of capacitive touch sensors in systems where it is desirable to provide substantial isolation between the equipment operator and the system control circuits. An example of this type of input control pad may be found in machinery control panel applications where it is desirable to provide a significant degree of environmental safety, not only for the electronic circuitry incorporated into the control panel, but also with respect to a human operator inputting commands through the keypad. Most prior art capacitive keyboards have suffered from extreme environmental sensitivity wherein environmental changes cause false keystroke detection.

Prior efforts to provide capacitive keyboards which are self-correcting for environmental changes are described in Eichelberger et al.'s related U.S. Pat. Nos. 4,039,940; 4,145,748; and 4,290,052. The Eichelberger et al. capacitive keypad systems incorporate a circuit for digitizing the measured analog signal value of each keypad in a sensor array. Repeated samplings of the condition of the keypad reveal detected changes in the value of a given key. If the changes are above a predetermined threshold amount, a touch indication is given. The array is subjected to periodic calibration cycling which raises or lowers the predetermined threshold limit for detecting an intentional touch based on a corrected baseline value for the capacitor cell under a no-touch condition. The calibration cycling can increment or decrement the baseline value of the capacitor one step in either direction. Although the capacitive touch entry systems described by Eichelberger et al. tend to be self-optimizing and to interactively correct for changes in environmental factors, the single step corrections contemplated in these patents are not sufficiently adapted or fast enough to correct for commonly encountered environmental changes.

Accordingly, to overcome the deficiencies in the prior art devices, it is an object of the present invention to provide a new and improved capacitive measurement method and apparatus which directly measures the value of an unknown capacitance in a single step.

It is another object of the present invention to provide a new and improved proximity sensor for sensing the approach, nearness, and retreat of an object with respect thereto.

It is a further object of the invention to provide a new and improved human to machine input interface in the form of a new and improved keypad which is substantially unaffected by changes in environmental conditions surrounding the keypad location, which does not require physical contact between the operator and the active keypad elements, which continually and automatically recalibrates its field sensitivity to compensate for environmental changes and component aging and which is capable of discerning between an intentional keystroke and other sources of a variation in key value, for example, an accidental double key press, impact of an object other than a finger, such as a ball or a bird.

It is still another object of the present invention to provide new and improved methods for reducing noise from an analog electrical signal and for providing dynamic adaptive signal tracking to identify and adjust for environmental factors.

It is another object of the present invention to provide a new and improved method for detecting variations in an electrical signal above a predetermined amount in the presence of noise.

SUMMARY OF THE INVENTION

In accordance with these and other objects, the present invention in its several aspects comprises a new method for measuring capacitance which is uniquely suited to quantifying small variations in the value of a capacitor. The method is very fast, very sensitive, and may be inexpensively implemented.

The areas of application are many and may range from matching of capacitors, for applications such as active filters, to capacitive sensors and data input devices, such as the preferred sensorial, non contact, through barrier, keyboards.

Although only known physics equations are employed, apparatus for employing the present method in a cost effective manner has not been heretofore available. In order to utilize this capacitance measurement method, a way of nearly instantaneously measuring voltage is required, along with a very accurate and stable time base.

By way of illustration, a basic RC equivalent circuit, combining a DC voltage source, a switch, a resistor and a capacitor is shown in FIG. 1. The DC voltage, produced by the battery (V) and the switch (SW) in this analogous circuit form a pulse generator, or a means of applying a step voltage input to the resistor and capacitor network in series. Assume that the switch is closed at time t=0. At exactly this time, assuming a completely discharged capacitor, the capacitor appears as a negligible impedance (dead short), and all of the voltage V can be found across the resistor R. At any point in time where t is greater than 0, the capacitor will begin to charge and drop voltage across itself, reducing the voltage across the resistor. The resistor voltage follows the well known equation:

$$v = V * e^{-t/(R*C)} \quad (I)$$

wherein v equals the voltage across the resistor, V represents the total applied circuit voltage, e is the base of the natural logarithm (2.7183), t is the time elapsed since the application of voltage (switch closure) in seconds, R is the resistance value in Ohms, and C is the capacitor's value in Farads.

If it is the value of the capacitance in the circuit that is to be determined, it is necessary to know as accurately as possible the value of the series resistance R, and the exact value of the measurement interval t. Thereafter, using the following derived equation, we can determine the capacitance C:

$$C = \frac{t}{R} * \frac{1}{\ln\left(\frac{V}{v}\right)} \quad (II)$$

It is apparent from Equation II that the empirical values of v and V are not as important as the ratio they represent. One simply needs to know what percentage of the total applied circuit voltage can be found across the resistor (or, for that matter, the capacitor because whatever is not dropped across the resistor must be found across the capacitor) at the sampling interval t.

Although any t, where t is greater than 0, may be used as the sampling moment, it has now been discovered that there is an optimum value for t. It may be shown that the precision of measurement, or in the case of variance measurement, the sensitivity to change in capacitance value (as dv/Dc) versus the sampling moment t, has a unique maximum at t=R*C. This sensitivity (s) can be determined by:

$$s(t) = \frac{V*t}{R*C^2} e^{-t/(R*C)} \quad (III)$$

An important concept relating to the new and improved method of this invention is present in Equation III, namely that as the value of the capacitor gets smaller, the method of this invention becomes exponentially more sensitive. This means that as the capacitor value being measured gets smaller, the ability to detect variations about that value becomes markedly better, not worse. The unique ability of this method to detect infinitesimal variations of very small capacitors has many applications, some of which should be obvious to those skilled in the art of electrical engineering.

The above mentioned Equations and discussion refer to somewhat idealized circuit models and behavior, In a real world application of this method, it is important to know how tightly the sensitivity needs to be controlled for good results to be obtained, i.e., how much Δt can be tolerated? The derivation for Equation III is as follows:

$$\frac{dv}{dC} = \frac{d(V*e^{-t/(R*C)})}{dC} = V*e^{-t/(R*C)} \frac{t}{R*C^2} = s(t) \quad (IV)$$

In order to determine the extremes of this function, the first order derivative has to be computed and the equation ds/dt=0 has to be solved:

$$\frac{ds}{dt} = \frac{V}{R*C^2} * \frac{d(t*e^{-t/(R*C)})}{dt} => \frac{ds}{dt} = \quad (V)$$

$$\frac{ds}{dt} = \frac{V*e^{-t/(R*C)}}{R*C^2} \left( 1 - \frac{t}{R*C} \right) \quad \frac{V}{R*C^2}\left(e^{-t/(R*C)} - \frac{t}{R*C}e^{-t/(R*C)}\right) \quad (VI)$$

$$s'(t) = 0 => t = \frac{1}{R*C} \quad (VII)$$

The main function s(t) is strictly positive, and equal to zero for both t=0 and t=∞, which means that the unique point of extreme found is a maximum. For t=R*C, the sensitivity becomes:

$$S_{max} = s(t = R*C) = \frac{V}{e*C} \quad (VIII)$$

This means that the sensitivity goes up as the initial (reference) value of the capacitor goes down, and that the value of the applied voltage V should be as big as possible.

It is also important from the implementation standpoint to know how far can we stray from this optimum value t=R*C? In other words, how do variations of the sampling moment t affect sensitivity (s)? Expressed somewhat differently, permissible tolerances around the sampling moment t, referred to as a sensitivity envelope, should be known for best results. Accordingly, if m is the measuring moment or envelope width, then for a sampling moment $t_1=m*t_0$, the sensitivity variation is expressed as follows:

$$\frac{s(t_1)}{s(t_o)} = \frac{\frac{V}{C} \frac{m*t_0}{R*C} e^{-\frac{m*t_0}{R*C}}}{\frac{V}{C} \frac{t_0}{R*C} e^{-\frac{t_0}{R*C}}} = m * e^{-\frac{t_0}{R*C} (m-1)} \quad \text{(IX)}$$

By plugging in some different numbers for m, the following results are obtained: if m=0.98 (a 2% variation of the sampling moment) and $t_0$ is approximately equal to RC, then a 0.02% variation in sensitivity s results; if m=1.02 (also a 2% variation), the same result, a 0.02% variation in s is obtained; and for m=0.095 (a 5% variation), a 0.13% variation in s is obtained. In fact, if m=1.2, a 20% variation in the position of the sampling moment, a low 1.7% variation in sensitivity results. These calculations reveal that only the stability in time measurement is important for this method, while the absolute position of the sampling moment is of secondary concern.

A major factor for satisfactorily applying this method is providing an acceptable means for making instantaneous voltage measurements. The currently preferred means of instantaneous voltage sampling is an analog-to-digital (A/D) converter circuit. Using an A/D circuit, the precise moment t when the voltage across the resistor is sampled may be predetermined and controlled. The sample is also readily converted by the A/D converter to a numerical value that is easy to manipulate. Where n is the number of bits of the A/D converter used, and k is the converted value of the sample (it is assumed that the full scale of the A/D converter is equal to V), then the measured voltage sample v is:

$$v = k * \frac{V}{2^n} \quad \text{(X)}$$

Around t=R*C, one step of the A/D converter equals a variation in the value of the capacitor equal to:

$$\frac{\Delta C}{C} = \frac{e}{2^n} \quad \text{(XI)}$$

For an eight bit A/D converter, this translates into a detectable capacitance value variance (measurement precision) of 1.06%, and a remarkable 0.26% for a 10 bit A/D!

The new and improved method, in this context, is considered optimum for applications concerned with small variations around an initial value (or reference value) of C, wherein the optimal sampling moment t can be predetermined and controlled with a large degree of practical accuracy.

In accordance with another aspect of the present invention, a new and improved circuit for measuring the value of a capacitor or for detecting changes in the value of a capacitor around a reference value is provided in a detector circuit comprising: a substantially constant load impedance R connected in series with the capacitor; means for providing a voltage input of known wave form to the detector circuit; means for measuring an instantaneous sample voltage v across a circuit element selected from the load impedance or the capacitor after a known time interval T has elapsed, the sampling moment being in a predetermined fixed phase relationship to the input voltage V; and means for precisely controlling the time interval T, whereby the value of the capacitor or changes therein may be computed or detected solely by considering the value of the sample v, the elapsed time T, known load impedance R, and amplitude and wave form of the input voltage V.

An example of a practical implementation of this method is shown in FIG. 3. All of the essential functional elements of the detector circuit are shown. In FIG. 3, C is the capacitance to be quantified. The R+SC block is the resistive element, and includes any signal conditioning required by the application.

A microprocessor/controller and interface provide the calculation and result in yielding (analysis) means. Although a pulse generator (Gen.) is shown as a separate block, a buffered clock signal output from the microcontroller could serve this purpose. The analog to digital converter A/D function block supplies the instantaneous voltage measurement means.

By using a micro-controller, we are able to easily construct a digital control circuit with a precision oscillator, employing a precision quartz crystal element Y as a reference. By using said device, and deriving all signals from it, we have an excellent precision timing reference means. The pulse generation, the sampling and hold function, and the A/D device can be controlled by the same micro-controller. The precision of the time base of the micro-controller is translated directly into the precision and stability in time of the sampling moment t (around 10 to 100 ppm for a quartz TTL oscillator) which is much better than the errors due to the A/D converter (390,625 ppm for an eight bit A/D converter and 976.5 ppm for a 10 bit A/D converter).

In any application of this method, it would be convenient to use the programmability aspect of a microcontroller. This attribute is especially useful where we are attempting to detect variations of the value over time of the capacitive component under test. We can program the circuit to measure the capacitance of the device under test at specific, repeated intervals of time. In a proximity detection application, for instance, where the capacitor's value is purposefully variable, we may program the circuit to repetitively test the capacitor, reporting any variances through the interface to some other control or actuation circuit.

In reference to FIG. 3, we start the application of the new and improved method by programming the microcontroller. This micro-controller program must be structured to cause the following cycle of events to take place:

1. The program cycle must begin with acquisition and incorporation of values for the open-circuit full-range voltage V, the reference resistor R, and some approximation of C. For most applications, these values can be assumed constant and programmed as predetermined.

2. The micro-controller actuates the Gen. means to apply the voltage step function to the RC network at t=0.

3. At approximately t=RC, the micro-controller actuates the A/D means to convert value v to a digital form, deriving k, which is subsequently transmitted back to the microcontroller.

4. The micro-controller analyzes k, according to the program and the intended use of the circuit.

The new and improved method and detector circuits of this invention may be used in a multitude of applications, wherever the quantification of capacitance variation is meaningful. Other objects and advantages of the present invention will become apparent from the following detailed description of the invention taken in conjunction with the Drawings in which:

DETAILED DESCRIPTION OF THE PREFERRED EMBODIMENTS

Figure 1:
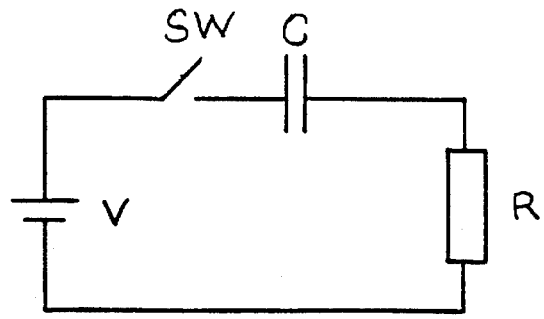
FIG. 1 is a schematic view of an idealized RC circuit provided to assist in an understanding of the theoretical underpinnings for the new and improved method of the present invention.
Figure 2:
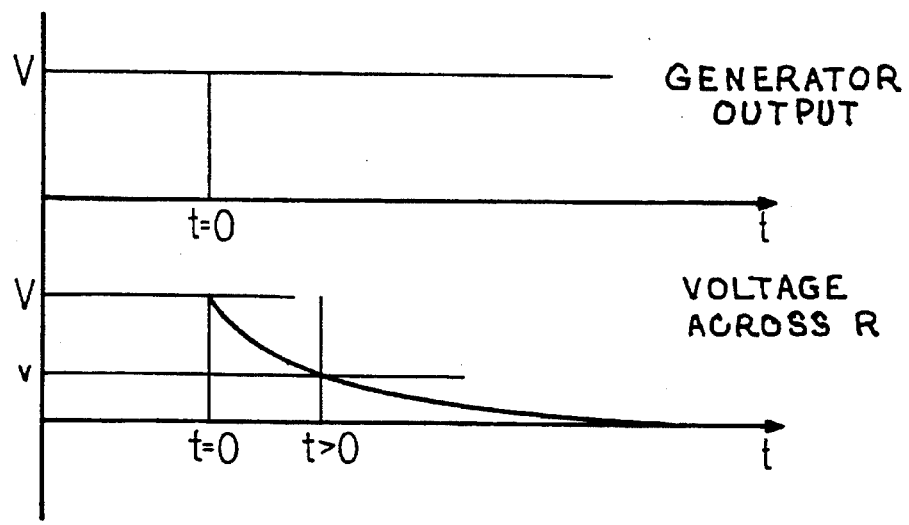
FIG. 2 is a schematic graphical illustration of a timing diagram illustrating the behavior of the RC circuit of FIG. 1 after a step voltage input is applied.
Figure 3:
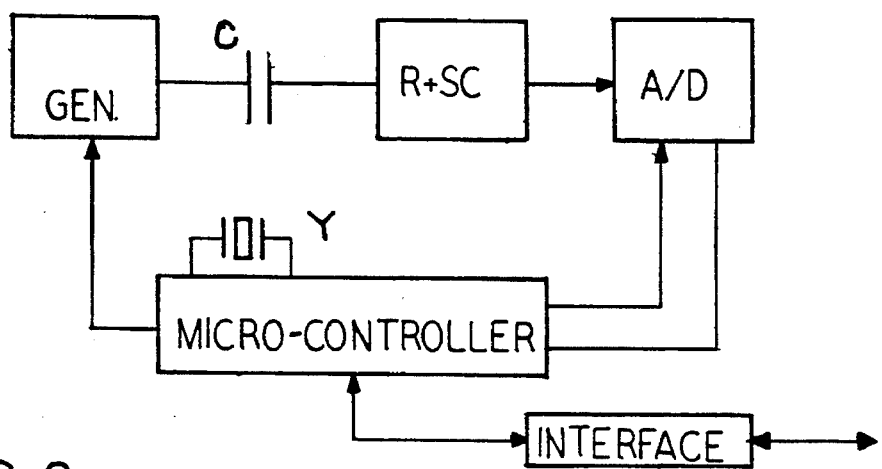
FIG. 3 is a schematic view of a preferred detector circuit for implementing the new and improved method of this invention.
Figure 4:
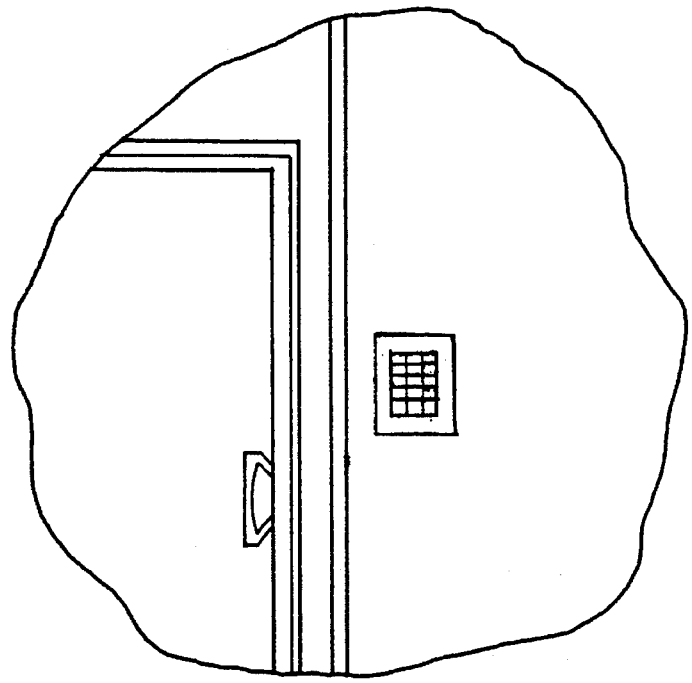
FIG. 4 is a perspective view of a new and improved human-to-machine interface including a solid state no-touch keypad in accordance with this invention shown in use as an electronic keyless door entry module displayed in a window adjacent a door access opening.
Figure 5:
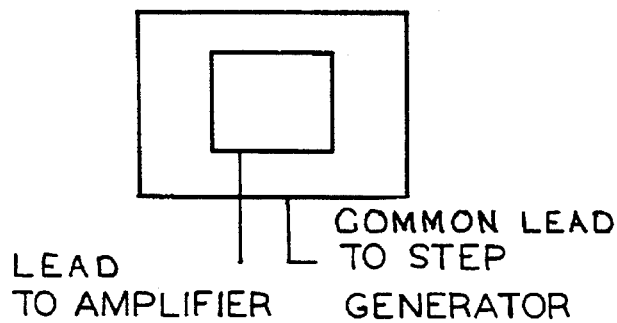
FIG. 5 is a schematic view of a sensor cell in accordance with the present invention.
Figure 6:
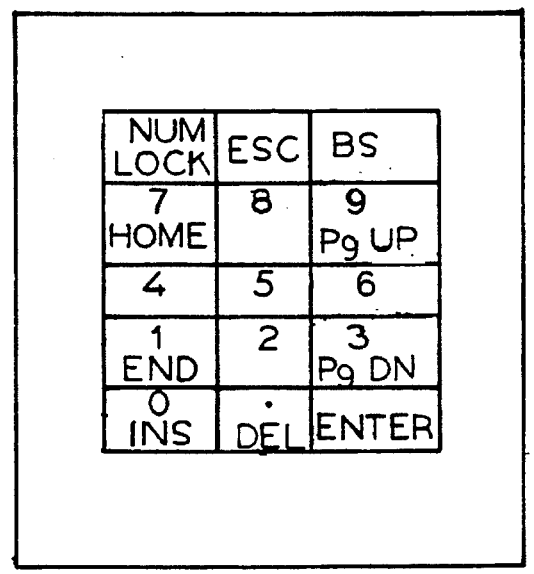
FIG. 6 is a schematic view of the front human interface surface of the new and improved key pad of this invention.
Figure 7:
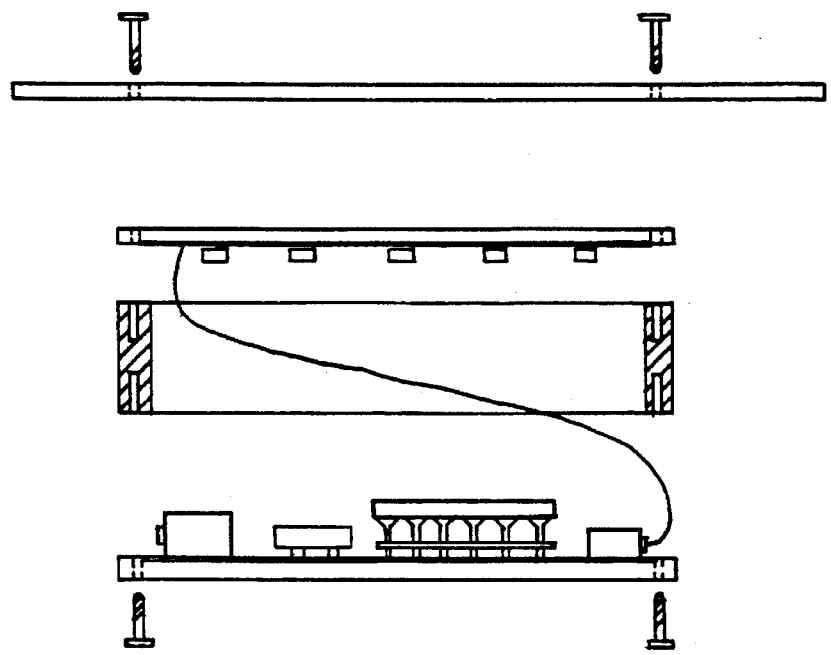
FIG. 7 is an exploded side view of the new and improved keypad of this invention.

The new and improved method of the present invention is especially well suited for quantifying small variations in the value of a capacitor. We will explore one of the many practical applications for this method in the form of a solid-state capacitive keyboard depicted in FIGS. 4–9. In this end use application, we employ a proximity transducer that behaves as a variable capacitor when its electric field is disturbed by an operator's finger.

The idea of a capacitive keyboard is not new; there have been many attempts to introduce the benefits of a solid-state keyboard with no moving parts to the marketplace. Ultimately, however, each previous attempt has been a commercial failure due to high cost, complexity, and environmental sensitivity (false keystroke detection).

For the purposes of demonstration, we have constructed a personal computer numeric keypad array with 15 keys, or "Sensor Cells", however any number of Sensor Cells may be incorporated into an array, within practical ergonomic and transmission line length limits. We employ a micro-controller to drive and receive data from the array of sensor cells. In the preferred embodiment depicted in the drawings, a Motorola® 68HC05 series microcontroller is used which also has enough peripheral I/O topology available to provide an interface to a standard personal computer keyboard port. Our selection of this particular micro-controller was virtually arbitrary; any such device or number of devices with similar attributes, including a discrete logic topology, could be a suitable (if not superior) substitute.

This example keyboard includes three major component parts or assemblies, namely, a Sensor Cell Array, a micro-controller board with associated hardware, and the micro-controller software control instruction set or programming.

In total, this example 15-key array keyboard has 23 active components: one standard 2N2222 bi-polar transistor for each sensor element, a Motorola XC68HC705P9S micro-controller, a 7406 TTL chip, 5 diodes and one LED. We are sure the superlative performance and cost-effectiveness of this device will soon become apparent.

First, let us examine an individual sensor Cell. The Sensor Cell is a proximity transducer which satisfies the first two "means" requirements of the Capacitance Measurement Method. The sensor cell provides the capacitance to be measured, which varies in value according to the relative proximity of an operators's finger and/or other appropriate actuator, and provides an electrically resistive element of known or substantially constant value, including any signal conditioning required by the application.

Our Currently preferred embodiment of a Sensor Cell Capacitor (the capacitance to be measured) is fabricated as follows: A variable capacitor element, denoted as C1XX on the schematic diagram, is constructed in a planar fashion, with 2 concentric conductor rings spaced conveniently apart, with an arbitrarily determined outside diameter of 0.75" (based on the size of the "key" we wanted, with a practical size range of 0.5" to 3"), fabricated from copper traces on one side of standard printed circuit board stock. Two conductive leads, one from each ring, are passed through to the opposite side said circuit board. The conductive lead from the outer conductor ring is considered the Cell input, and is electrically connected to all like leads from the other Cells in the array, and ultimately connected to a periodic voltage input means of known wave form. The other lead, considered to be the output of the element, is connected to a signal conditioning means.

Our currently preferred embodiment of a Sensor Cell also includes signal conditioning and partial output signal multiplexing means physically localized to the variable capacitor element. This signal conditioning means also serves as the resistive element, and is fabricated as follows: A single conventional bi-polar transistor (like the 2N2222) of a manufacturer's specified beta range (avoiding wide variances of beta), denoted Q1XX on the schematic diagram, and two biasing resistors, which together form a basic common emitter amplification configuration. The base resistor is unique to the individual Cell. The collector resistor is shared by 4 other Cells in a row, and forms part of the multiplexing means. In an array, it is preferred to not have extraordinarily wide ranges of beta among transistors. The input impedance of the amplifier ($h_{ie}$) provides the resistive or load impedance circuit element.

In this preferred embodiment, the Vcc supply is conveniently furnished by a personal computer keyboard port, and is +5V.

The inputs for all Cells in the array are tied to a common voltage input means. The output of the Cell is taken at the collector of the transistor, and the emitter is tied to ground through an electronic switch in the micro-controller. When the switch is closed, the emitter is tied low, the transistor amplifier is biased active, and an output is present. If the emitter is forced high, the transistor will not be biased, resulting in no output. This emitter switching allows us to easily multiplex the Cells in the array, and will be thoroughly discussed hereinafter.

The common emitter amplifier in the Sensor Cell performs two more important tasks. First and foremost, the $h_{ie}$ (or input impedance) of the amplifier satisfies the Capacitance Measurement requirement for a series resistive element means of known value (actually, in this application, it is more important for this value to be constant dynamically than be of a specific empirical quantity). Secondly, the amplifier performs a signal conditioning function, amplifying the Sensor Cell capacitor's signal, and matching impedances to reduce the effect of transmission line reactive parasites.

Figure 10:
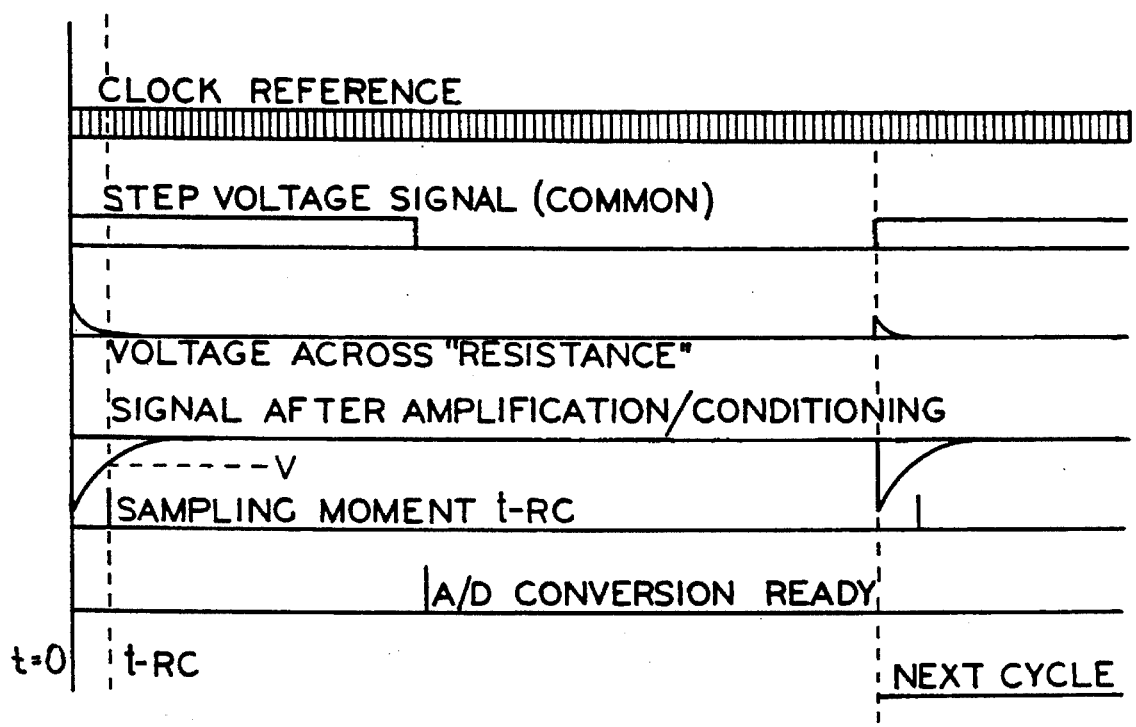
FIG. 10 is a schematic timing diagram for the new and improved key pad device of the present invention.

According to the present method, a step voltage function is applied to the input of the Sensor Cell at t=0. At the approximate optimum time period t=RC, the output of the Cell is sampled. This value is then converted to a digital form and stored in the micro-controller (k). This is done about once every 50 milliseconds. The provided timing diagram shown in FIG. 10 is not to scale. The clock reference used in this circuit is 2 Mhz, or has a period of 0.5 microseconds. The Cell sampling cycle is performed approximately every 50 milliseconds (one row every 10 Ms). The only timing element actually critical to the success of circuit operation is the elapsed time between t=0 and the sampling moment, t=RC. The sampling moment T must be very nearly exactly the same each time a Cell sampling cycle is performed.

Notice also that the output curve of the common-emitter amplifier is inverted, or 180° out of phase with the input. This does not matter, as long as the inversion is known and taken into account.

What happens when a finger approaches a Cell? Strangely enough, the Sensor Cell Capacitor is not really "capacitive" in the strictest sense of the word, although we are able to analyze the behavior of the Sensor Cell circuit with a capacitive analogy. In a physical sense, the "plates" of the "capacitor" in the Sensor Cell are actually a transmitting/receiving antenna pair. The input voltage function we apply to the transmitting conductor is radiated to the other conductor and amplified to produce a quantifiable signal. When an operator "presses" a key, he is actually attenuating or "robbing" field energy, reducing the magnitude of the received signal. As far as the circuit is concerned, the value of capacitance in the Sensor Cell Capacitor has diminished with a finger in proximity to the Cell. However, the actual output of the Sensor Cell, because of the inversion characteristic of the signal conditioning amplifier, will increase (the Cell will appear to gain capacitive value, or v) with the approach of a finger.

Unfortunately, the apparent capacitance of a variable capacitor employed in a real world capacitive keyboard, including both ours and prior art devices, can change in response to factors other than the approach of an operator's finger. Humidity, temperature, dust, environmental contamination, electrical noise, and component aging, and airborne debris are just a few of the factors that must be considered. In this sense, the Sensor Cell has a dual purpose. It not only registers the proximity of an operator's finger, it is also called upon to perform the function of an environmental change transducer.

The unique properties of the Sensor Cell make it ideally suited for this application. Because this keyboard can be operated from behind a rigid, non-metallic barrier, it will soon find its way into adverse environment use. Because "key" actuation requires the absorption of field energy, a disembodied object striking the keyboard would be unlikely to register a keystroke. It virtually requires a finger to cause a key stroke to be registered or detected. The safety advantages are obvious. Spurious electromagnetic or radio frequency interference would tend to increase the Sensor Cell Capacitor's value (reducing Cell output or v), so these effects would also be unlikely to cause erroneous keystroke detection.

Unlike capacitance sensors of prior art, the Hughey-Pisau Sensor Cell has a response to field disturbance that is analog in nature. The closer the finger is to the Cell, the higher the magnitude of absorbed field energy, the higher the value of v reported. Prior art sensors, especially those with an extra metal plate within the field for variance exacerbation, such as Eichelberger et al., were decidedly digital in nature, and could not sense the approach of a finger until it actually touched the sensor. This also greatly reduced the prior art sensor's sensitivity to environmental changes. The Hughey-Pisau Sensor Cell is sensitive enough to begin sensing a perturbation of the field before the arrival of the finger, and can also detect variations in environmental conditions that would go unnoticed in prior art technology. This enhanced sensor sensitivity allows far greater precision in environmental compensation, and the subsequent suppression of erroneous keystroke detection.

The 15 Sensor Cells of the example Hughey-Pisau Keypad Array are electrically arranged into 3 columns and 5 rows. The transistor emitters of the amplifiers in each 3 cell row are tied together, then connected to ground through a row-specific electronic switch (actually a TTL compatible HCMOS output) within the micro-controller. The 5 Cells in each column have their collector outputs tied together, and connected to one of 3 unique inputs in the micro-controller. This configuration allows for a novel approach to multiplexing, or "addressing" each Sensor Cell in the array. Since we practically need only examine the value of one Sensor Cell at a time, we can examine a specific Cell by actuating the FET switch for the row the Cell resides in (turning on the amplifier), then sampling the Cell's value through the A/D converter channel for that Column.

In the context of the Hughey-Pisau Method of Capacitance Measurement, the microcontroller must fulfill the remaining requirements not satisfied by the Sensor Cell Array, i.e., a voltage input means having a known wave form; a precision timing reference; an instantaneous voltage measurement means; and a calculation or analysis means (and/or an interface to said means). The use of an off-the-shelf micro-controller merely suggests simplicity and expediency. We could have designed a circuit with the necessary attributes from discrete logic, or procured a custom designed chip. One must implement the microcontroller means in any case, and the following functional attributes must be included (based on the previously discussed array design): One 4-bit (minimum) analog to digital converter means; Array Cell addressing means; permanent software storage means (ROM) of sufficient size to hold the program; temporary software storage means ("scratch RAM") of sufficient size to store data during program execution; clock signal generation and reference means; periodic voltage signal input means; and interface means to allow conveyance or communication of results.

More particularly, the selected micro-controller satisfies these requirements in our 15-key example by possessing the following functional attributes an 8-bit A/D converter; 4:1 analog MUX circuit for array column addressing, and more than 5 TTL-compatible outputs for row addressing; 2048 Bytes of available ROM; 128 Bytes of available RAM; internal clock reference generation circuit, requiring only an external crystal reference; a programmable TTL-compatible output for step voltage signal generation; and an interface port with associated signal lines.

Figure 8:
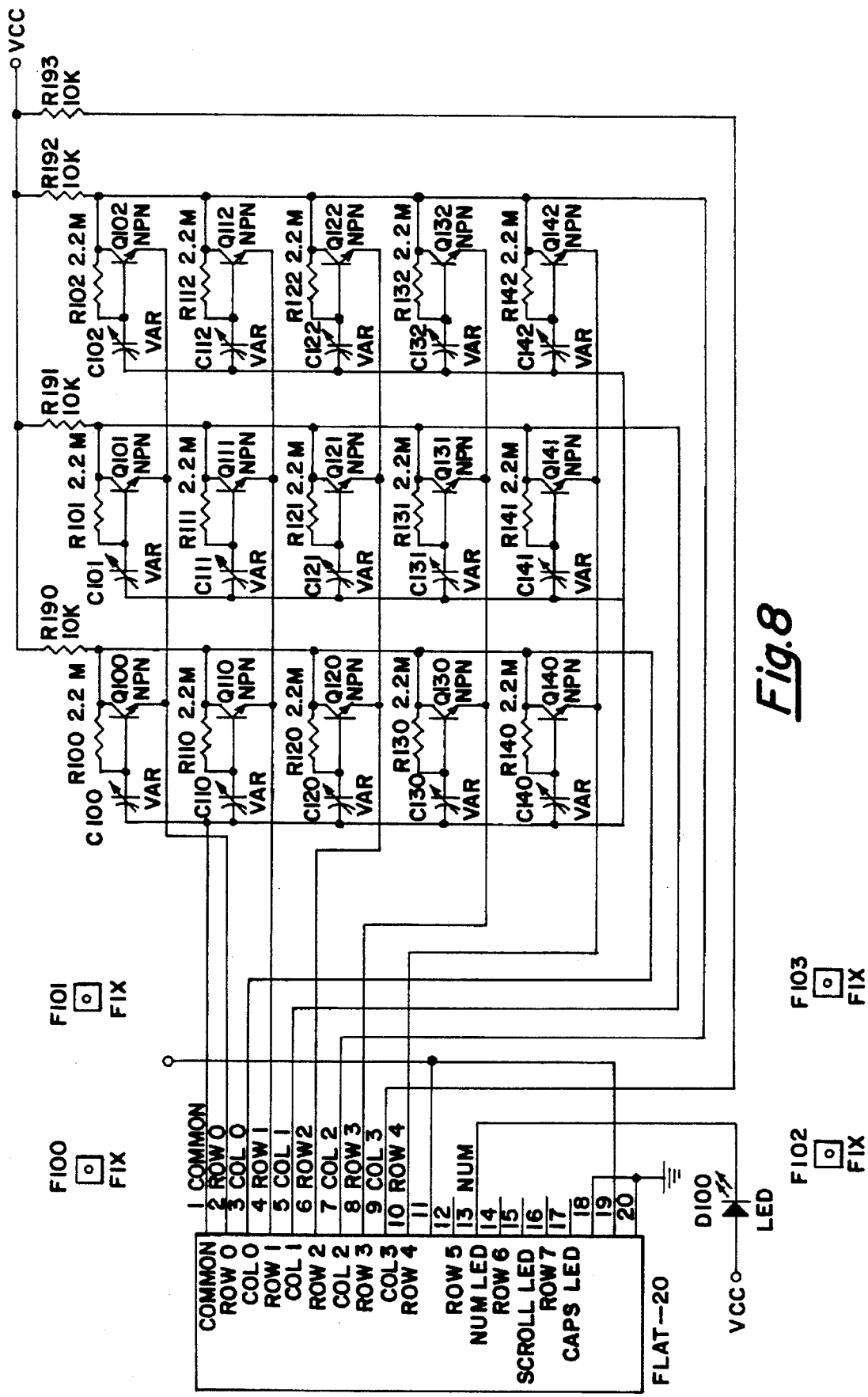
FIG. 8 is a schematic circuit diagram of the sensor board in the new and improved keypad of this invention.
Figure 9:
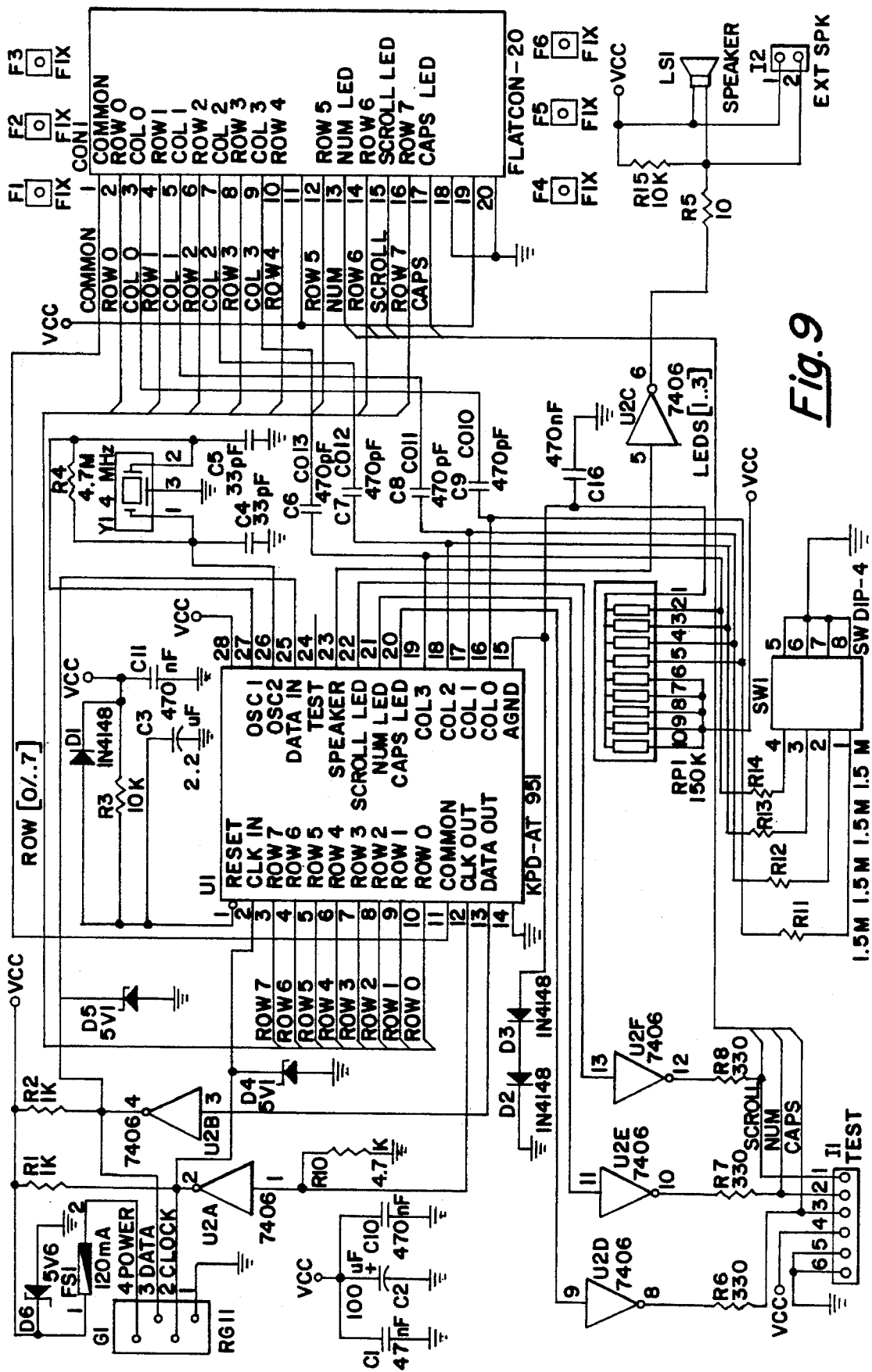
FIG. 9 is a schematic circuit diagram of the detector board in the new and improved keypad of the present invention.

Referring to the schematic diagram of the preferred embodiment example shown in FIGS. 8–9, the microcontroller is represented as component "U1", and is additionally labeled "KPD-AT 951". The actual pins of the chip are represented as by an identifying number 1 through 28, and their associated signal function in the topology is indicated as well (note that our pin definition nomenclature on the schematic differs substantially from published Motorola data).

Pin 1 is the obligatory RESET line. Pins 2, 12, 13, and 25 provide the interface signal lines. Pin 11 is the COMMON line, which is a programmable HCMOS TTL-compatible output that serves as the step pulse generation means, and is consequently attached to the input of all the Sensor Cells in the array. There are 8 standard HCMOS TTL-compatible output lines, Pins 3–10, that are designated as ROW0 to ROW7. The 5 outputs ROW0 through ROW4 are used as part of the previously discussed array Cell addressing means, switching certain rows of amplifier emitters to ground on command. The remaining 3 outputs, ROW5, ROW6, and ROW7 are unused in this application and are unconnected. Pin 14 is logic ground. Pins 16, 17, 18, and 19 form the inputs for the built-in 4:1 MUX as previously described. They are labeled COL0 through COL4, respectively, and are attached to the collector outputs of each Sensor Cell common to a specific column. Since there are only 3 columns of Cells, COL4 is not needed, and is pulled up to Vcc by a 150 KΩ resistor. Pin 15 is the DC voltage reference used by the A/D converter, and from the array point of view, is analog ground and is therefore labeled AGND.

Lines 20, 21, and 22 are used to illuminate LED's in accordance to the personal computer keyboard interface standard, and are generally superfluous to functionality. There is another output, Pin 23, which is used through a buffer to drive a speaker. This is used to supply a user with audible feedback regarding keystroke detection. The Pin 24 TEST line is not connected. Pins 26 and 27 are used to connect the external crystal clock frequency reference, and are labeled OSC1 and OSC2. Pin 28 is Vcc.

The purpose and functionality of the remaining components in the topology should be obvious to those skilled in the art of electronics engineering.

What makes this capacitive keyboard truly sensational is our software algorithm for keystroke detection. False triggering, environmental drift, and erratic operation, the hallmarks of prior art capacitive keyboards, are virtually eliminated with the flexibility and adaptability of software controlled keystroke detection.

Why is keystroke detection so critical? Because many things can cause the apparent capacitance of a key to change, not just an operator's approaching finger (especially in prior art). Humidity, temperature, dust, environmental contamination, electrical noise, and component aging are just a few of the factors that must be considered.

The micro-controller software program must do more than just provide keystroke detection functionality, it must furnish the instruction means necessary to cause the entire device to function as intended.

The software must contain the following characteristics:

1. Instruction sequence means which takes into account the predetermined values for the V and RC variables according to the Hughey-Pisau Method;

2. Instruction sequence means to cause an individual sensor Cell in the array to be addressed.

3. Instruction sequence means to cause the proper functional element of the micro-controller to apply a step voltage signal to the COMMON line at the moment of t=0.

4. Instruction sequence means causing a sample of the output of the sensor Cell to be taken at the relative instant of t=RC, and converted to digital form by the A/D converter means.

5. Instruction sequence means causing said digital form of sensor Cell output to be stored, in a location unique to that individual sensor Cell, within the temporary software storage means.

6. Instruction sequence means causing a complete cycle of steps 2 through 5 to be continuously repeated until the values for all the sensor Cells in the array have been stored at unique locations within the temporary software storage means; said instruction sequence hereinafter referred to as an Array Sampling Cycle (ASC).

7. Instruction sequence means causing a continuous plurality of Array Sampling Cycles, storing the values from one or more cycles in unique locations within the temporary software storage means.

8. Instruction sequence means causing an analysis of stored Cell values to determine if a pattern of change is taking place in one and/or a plurality of Cell values across a plurality of Array Sampling Cycles.

9. Instruction sequence means to register a keystroke, and invoke an appropriate response, if said analysis of Cell value(s) over time indicates a high probability that any pattern of change(s) in Cell value(s) is specifically due to an operators finger attempting to actuate (or "press") a specific key.

10. Instruction sequence means to prevent false registration of a keystroke, if said analysis of Cell values over time indicates a high probability that any pattern of change(s) in Cell value(s) is specifically not due to an operators finger attempting to actuate (or "press") a specific key.

11. Instruction sequence means to determine if said analysis of Cell values over time indicates that an environmental change has taken place, and instruction sequence means for environmental compensation.

12. Instruction sequence means to control the interface to other device(s).

Since it should now be apparent that our unique solution to steps 9 through 11 is the essence of our device's superiority over the prior art, we will cover these steps in detail.

All capacitive keyboards, including ours, continuously measure the capacitance of the sensors in the array, and examine any changes. Virtually all prior art capacitive keyboards, however, relied on a hardware implemented, simple, straightforward determination of a keystroke; did the value of a specific capacitor sensor change more than a certain, predetermined (or threshold) amount (or percentage) over a specific reference value for that sensor (usually derived from past sensor measurement and comparison activities)? If it has, then it is assumed that this change must be because of an operator attempting to "press" a key, so a keystroke is registered. If not, then is there any change at all? If there is some change, but the change is less than the predetermined amount, then its is assumed that the change must be because of an environmental phenomenon, and is usually ignored, except when a specific calibration cycle is taking place.

The predetermined threshold amount of change of sensor value considered to be indicative of a keystroke is usually derived from the designer's estimation of how much sensor value should change with the touch of a finger, versus how much change of value environmental conditions could induce, during a single sampling period. In other words: If the new sensor value is different than the reference (or adjusted old sensor value), and this difference is greater than the threshold amount, then register a keystroke. If the new sensor value is different than the reference sensor value, and this difference is less than the threshold amount, then ignore it. If this is a specific calibration cycle, however, then the reference sensor value is adjusted by some degree in the direction of the change, and this adjusted value is used as the reference sensor value in subsequent comparisons.

The degree of adjustment for the reference sensor value is typically referred to as one or more "steps" and for those devices using an A/D converter to derive sensor values (including ours), one step is equal to one or a sequential plurality of bit arrangements used to define sensor value, also referred to as one "count" in prior art discussions.

For a mathematical representation, we will let the sensor reference value equal $k_r$, the new sensor value equal $k_{nc}$, and the threshold difference amount equal to $k_{tc}$.

If $K_{nc}=k_r$, then do nothing.

If $K_{nc} \neq k_r$, then examine the difference.

If $k_{nc} \geq k_r + k_{tc}$, or $k_{nc} \leq k_r - K_{tc}$, then register a keystroke. Subsequently, on specific calibration cycles:

If $k_r < k_{nc} < k_r + k_{tc}$, then increment $k_r$ by one step.

If $k_r > k_{nc} > k_r - k_{tc}$, then decrement $k_r$ by one step.

Sounds rather simple, and it is. These simple assumptions, concerning a degree of sensor value change in prior art, range from occasionally erroneous to downright dangerous, depending on the application. What happens if an aperiodic noise transient, either radiated through the air, or more likely, conducted through the power supply, causes the $k_{nc} \geq k_r + k_{tc}$ condition to be satisfied? What if an operator "presses" and "holds" a key (or releases a key too slowly)? What happens if the device is mounted near an exterior door, near a source of liquid "splash", or anywhere very rapid environmental changes can take place? What happens during a "collision" of a keystroke and a specific calibration cycle? False keystroke detection occurs.

The fact that we use a software means to implement keystroke detection, allows a much more thorough analysis of any changes in Sensor Cell Value than could ever be realistically possible (certainly commercially practical) in hardware means. A software implementation also allows for easy adjustment to the keystroke detection methodology during device manufacturing or for specialized applications. Described is the actual method our preferred embodiment employs. It will also become obvious to anyone skilled in the art, that substantial variations to the methodology presented would be relatively easy to develop and employ.

The Hughey-Pisau Software Algorithm possesses the following specific advantageous attributes for proper keystroke detection:

"Debouncing" or redundant confirmation that a specific Sensor Cell value has satisfied the $k_{nc} \geq k_r + k_{tc}$ condition, on both key press and key release events.

Detection threshold hysteresis, or a threshold level reduction during a confirmed keypress condition, changing the value of $k_{tc}$ for a specific Cell in a keypress condition.

Optionally, an asymmetrical environmental adjusting mechanism, preventing the device from confusing a slowly approaching finger with an environmental change, yet still allowing the device to rapidly become re-operational after a drastic environmental change. This is accomplished by allowing only certain "windows of opportunity" for reference values to be adjusted, and allowing more potential downward (away from keypress condition) adjustment opportunities than upward (toward keypress condition). Our mechanism also prevents keystroke and calibration cycle "collision".

Optionally, forcing a consistent trend of change to be present before any reference value modification takes place. This is defined as the use of a "trend counter".

The above attributes of our software virtually eliminate false keystroke detection, and condition the device properly to function as intended in a wide variety of environments and situations. Below is a more thorough description of how these attributes are derived.

Power is applied to the device, or a reset condition has occurred. After the typical hardware self-diagnostic instruction series is performed, the software means causes appropriate environment structuring (initialization) to take place. Included in this structure are the necessary routines for ASC execution, array multiplexing, the interrupt service routines for interface control, and the creation of counters, flags, and other instruction means in memory. All counters are initialized at midpoint. The first ASC is executed, and the values read from all of the Cells in the array are stored in unique, individual Cell address locations to be used as reference values. These reference values are modified only when certain conditions are satisfied.

In the current embodiment, 16 counter means are created. 15 are 2 bit counters (larger ones are preferred if storage means size permits), one for each of the 15 Sensor Cells in the array. These counters are assigned to specific Cells in the array, and are used to detect the trend of value change in the Cell (we'll call them "trend counters"). This is done by totalling the number of ASCs for which that specific Cell increased in value, but not enough for a keystroke detection ($k_r < k_{nc} < k_r + k_{tc}$ and $k_r > k_{nc}$). If $k_r < k_{nc} < k_r + k_{tc}$ is true for that Cell, and an upward calibration cycle is being executed, the counter is incremented. If $k_r > k_{nc}$ is true for that Cell, and a downward calibration cycle is being executed, the trend counter is decremented (we know that because of the Sensor Cell's electrical behavior, a keystroke will always be represented by an increase in value, never a decrease).

The 16th counter is a calibration cycle counter and is 8 bits wide (7 used). It is important to note that given a larger size memory means, a 17th counter could be created to provide both an upward and a downward calibration cycle counter, and these counters could have different values. The current (not necessarily preferred) embodiment of the software has a asymmetric calibration timing of 128:1 (downwards to upwards). A preferred embodiment may employ a 4:1 ratio, a 1:1 ratio or even a 1:128 ratio, depending on the application.

A calibration cycle is a subroutine entered during an ASC (not an independent cycle, as in prior art) only when 2 conditions are met. An up calibration cycle is entered when the individual Cell being addressed has a value that means the $k_r < k_{nc} < k_r + k_{tc}$ criteria (the Cell's value is larger than its reference value, but not large enough to be considered to be in a possible keystroke condition), and the upward calibration cycle counter, after incrementation is in a carry ("upward overflow") state. A down calibration cycle is executed when the Cell value meets the inverse criteria $k_r > k_{nc}$, and the downward calibration counter, after decrementation, is in a borrow ("downward under flow") state.

As in our current embodiment, we may elect to use the same calibration cycle counter for both upward and downward calibration cycles. The counter is incremented at each measurement cycle. If the last 7 digits are zero, it is an up calibration cycle. If the last 3 digits are zero (binary arithmetic), then it is down calibration cycle. Because it is a single counter, the values are not independent, and the device becomes limited in flexibility of calibration cycle timing. A preferred embodiment would employ 2 counters.

Just because a calibration cycle subroutine condition has been met, however, does not mean an adjustment of the reference value. There is still the trend counter for that Cell to consider.

If the conditions for a calibration cycle have been met for a specific Cell, then that specific Cell's trend counter is. If the conditions for a calibration cycle have been met, the Cell's trend counter is. Only when the incrementation of the trend counter from an up calibration cycle causes a carry in the trend counter, is the reference value for that Cell allowed to be increased by one step. Conversely, only when the decrementation of the trend counter from a down calibration cycle causes a borrow in the trend counter, is the reference value for that Cell allowed to be decreased by one step. The individual reference values for all of the Cells in the array are maintained in this manner.

Regardless of whether or not a calibration cycle was executed, in the Cell's value read during this ASC is equal to that Cell's reference value, or fits either the $k_r<k_{nc}<k_r+k_{tc}$ or $k_r>k_{nc}$, we must examine one more issue before reading the next Cell (continuing with the ASC). Was this specific Cell's value found to be to be in accordance with the $k_{nc} \leq k_r+k_{tc}$ criteria during the last ASC? If so, then all registers associated with keystroke detection, such as the debouncing register, are reset to zero. This, if effect, tells the logic that the key has been released. The ASC then proceeds normally.

During an ASC, we find that a Cell's value differs from the reference value by more than the threshold amount. First of all, we know that the output of a Hughey-Pisau Sensor Cell increases when a valid actuation attempt is taking place. So, if the condition $k_{nc}>k_r$ is true it is not considered to be valid keystroke condition, and is therefore treated in the same manner as a $k_r<k_{nc}<k_r+k_{tc}$ condition. If the Cell value exceeds the reference value by more than the threshold amount, I.E. $k_{nc} \geq k_r+k_{tc}$, any calibration activity for that specific Cell in this ASC is prevented. Then, we ask the following question; has this $k_{nc} \geq k_r+k_{tc}$ condition been true for any other Cells during this ASC or the previous ASC? If not, then the Cell address is stored in the debounce register, and the debouncing flag is set (to 1).

During the next ASC, we find a Cell's value that meets the criteria $k_{nc} \geq k_r+k_{tc}$. Has this condition been true for any other Cells during this ASC or the previous ASC? Yes, it has. Was it the same Cell? If not, the condition is disregarded. If it is the same key, is the debouncing flag set? If not, set it and continue with the ASC. If the debouncing flag was set, decrease the threshold level for this Cell (invoke hysteresis), and call up the interface subroutine; we have a confirmed keypress. Terminate this ASC.

For the specific areas of the software associated with keystroke detection which form a part of the improvements provided by this method, this discussion has been presented. The other areas of the software design relate to standard of techniques which are commonly known to and employed by those skilled in the art of microcontroller programming.

Because of the fact that the Hughey-Pisau keyboard can be mounted behind, and operated through, any non-conductive surface of 0.001 to 1.0" thick, it is perfect solution where durability and protection are major considerations. It is also important to note that this technology can be made cost-competitive with demonstrably inferior membrane technology. This technology is also flexible; the application are limited only by the imagination. Some examples are:

Automatic teller machine keypads or "keyless" security devices that have to be protected from vandalism or tampering.

Data entry terminals in industrial environments, where airborne metallic powders and corrosive vapors prevent the use of conventional keypads or keyboards.

Pool-side equipment or automatic car wash systems.

Heavy manufacturing equipment, where a shock resistant keypad is needed in a small enclosure, such as the control panel of an industrial crane.

Zero footprint terminals—terminals embedded into the work surface, useful for machine tool control panels and laboratory workstations.

Point of sale terminals and cash registers, especially in fast food restaurants.

Keyboards for applications where sanitation or easy "washdown" is of utmost importance, such as medical laboratory or food processing equipment.

Museum, store window, or other public interactive exhibits or displays where "through window" key actuation would provide a more secure equipment environment with no "external" hardware.

Appliances, such as microwave ovens, ranges, and dishwashers.

Anywhere a keypad is employed, especially as a superior cost-effective alternative to membrane technology.

The can be employed as an excellent proximity sensor, even if applied with prior art capacitance measurement methods. For instance, the physical size of the Cell itself could remain the same, or be enlarged, for use in application such as security systems or manufacturing motion control. The Cell could also be miniaturized, and used by its incorporation into a video display means for "touch screen" applications, to provide touch-screen functionality from behind a protective cover.

The Hughey-Pisau Software Algorithm in its various potential attribute combinations, could be employed in any application where a sensor or array of sensors are used to gather data, which is converted to digital form for analysis. The redundant change confirmation (debouncing) module, and hysteresis of threshold value adjustment after change confirmation module, can each be used singularly or together, for a multitude of different data acquisition purposes. The asymmetrical environmental change calibration also has potential benefits in other areas of similar art, wherever there is an analysis "floor" of value that must be periodically adjusted.

Of specific and acute value in broader applications, is the Hughey-Pisau Noise Reduction or Filtering Method, used as part of the software algorithm. Implemented using our trend counters as described earlier, this logical method means has a wide area of viability in virtually any application where digital sampling means can be affected by noise. The types of noise effectively squelched by the application of this method include the quantization noise inherent in virtually all A/D converter applications, and white or pink noise. The only limitation of this method is the A/D sampling rate must be higher than the theoretical Nyquist rate. However, based on recent advances in the electronics industry, exceeding the Nyquist rate by oversampling has become common practice.

The Hughey-Pisau Noise Reduction or Filtering Method is a very fast logical algorithm means, with no complicated arithmetics to perform in real time, is simple to understand, and easy to implement. As it stands today, it is the best method for compensating slow environmental or other reference drifts which combines very good noise rejection, high speed, simplicity, technical elegance and low implementation costs.

What is claimed is:

1. A method for measuring the value of a capacitor comprising:

(a) providing a capacitor to be measured having a value of capacitance, C;

(b) electrically connecting said capacitor to a detector circuit, said detector circuit including a known load impedance, R, connected in series with said capacitor, means for providing a voltage input, V, of known wave form to said detector circuit, means for measuring an instantaneous sample voltage, v, across a circuit element selected from the load impedance or the capacitor being measured after a known time interval T has elapsed, said sampling moment being in a predetermined fixed phase relationship to the input voltage V and means for precisely controlling said time interval T;

(c) applying said voltage input, V, to said detector circuit and measuring the sample voltage, v, across the circuit element after said time interval T; and (d) thereafter, computing the value of said capacitor from the value of a single sample v, from said elapsed time interval T, from said known load impedance R, and from said known wave form of the input voltage V.

2. A method as defined in claim 1, further comprising: (e) temporarily storing the computed value of said capacitor.

3. A method as defined in claim 1, further comprising displaying the computed value of said capacitor.

4. A method as defined in claim 1, wherein said instantaneous sample voltage, v, is measured across said load impedance.

5. A method as defined in claim 1, wherein said instantaneous sample voltage, v, is measured across said capacitor being measured.

6. A method for measuring variations in the value of a capacitor comprising:

(a) providing a capacitor to be measured having a generally predetermined value of capacitance, C;

(b) electrically connecting said capacitor to a detector circuit, said detector circuit including a known load impedance, R, connected in series with said capacitor, means for providing a voltage input, V, of known wave form to said detector circuit, means for measuring an instantaneous sample voltage, v, across a circuit element selected from the load impedance or the capacitor being measured after a known time interval T has elapsed, said sampling moment being in a predetermined fixed phase relationship to the input voltage V and means for precisely controlling said time interval T;

(c) applying said voltage input, V, to said detector circuit and measuring the sample voltage, v, across the circuit element after said time interval T;

(d) thereafter, computing the value of said capacitor from the value of a single sample v, from said elapsed time interval T, from said known load impedance R, and from said known wave form of the input voltage V; and (e) repeating steps (c)–(d) at various times to measure variations in value of the capacitor, if any, with respect to time.

7. A method as defined in claim 6, further comprising: storing some of the computed values for the capacitor taken over time.

8. A method for detecting variations in the value of a capacitor comprising:

(a) providing a capacitor to be measured having a generally predetermined value of capacitance, C;

(b) electrically connecting said capacitor to a detector circuit, said detector circuit including a substantially constant load impedance, R, connected in series with said capacitor, means for providing a voltage input, V, of known wave form to said detector circuit, means for measuring an instantaneous sample voltage, v, across a circuit element selected from the load impedance or the capacitor being measured after a known time interval T has elapsed, said sampling moment being in a predetermined fixed phase relationship to the input voltage V and means for precisely controlling said elapsed time interval T;

(c) applying said voltage input, V, to said detector circuit and measuring the sample voltage, v, across the circuit element after said elapsed time interval T; and (d) detecting variations in the value of said capacitor, in excess of an assigned variation amount, from the sample v, from said elapsed time interval T, and from said known wave form of the input voltage V.

9. A method as defined in claim 8, wherein said assigned variation amount is a pre-programmed amount or a dynamically determined amount.

10. A method as defined in claim 1, wherein in said detector circuit the load impedance is a substantially resistive load R, said applied input voltage, V, has substantially a step wave form and the value of the capacitor, C, is determined from the equation:

$$C = \frac{T}{R} \times \frac{1}{\ln \frac{V}{v}}.$$

11. A method as defined in claim 10, wherein the means for measuring the instantaneous sample voltage, v, in said detector circuit comprises an analog to digital (A/D) converter wherein n is the number of bits of said (A/D) converter having a full scale substantially equal to V and k is the digitized value of the sample voltage, v, and the value of the capacitor C is determined from the equation:

$$C = \frac{T}{R} \times \frac{1}{\ln \frac{2^n}{k}}.$$

12. A method as defined in claim 8, wherein said load impedance R exhibits dynamic changes in value or exhibits a non-linear impedance characteristic.

13. A method as defined in claim 8, wherein said load impedance R in said detector circuit contains a large capacitive characteristic which creates a capacitive voltage divider in said detector circuit which reduces the maximum possible value of the sample V in relation to the value of the capacitance, C.

14. A method as defined in claim 13, wherein said load impedance R has a relatively large capacitive characteristic which varies in relation to value of the capacitor, C.

15. A method as defined in claim 1, further comprising the step of conditioning the signal being measured prior to said measuring step.

16. A method as defined in claim 8, further comprising the step of conditioning the signal being measured prior to said measuring step.

17. A method as defined in claim 8, wherein said variation in the value of said capacitor is represented by a processed numerical resultant representative of a measured per se or of a relational expression of a combination of variables, said variables including v, V, wave form, T and R.

18. A method as defined in claim 17, further comprising saving some processed numerical resultants.

19. A method as recited in claim 18, wherein said voltage input applying step is successively repeated at predetermined intervals of time.

20. A method as recited in claim 19, wherein said predetermined intervals of time are uniform intervals or variable intervals.

21. A method as recited in claim 18, further comprising the step of analyzing said saved numerical resultants with respect to time and identifying trends of changes in said numerical resultants.

22. A method for detecting variations in value of a plurality of capacitors arranged in an array, said method comprising:
   (a) providing an array of capacitors to be evaluated, each capacitor in said array having a generally predetermined value of capacitance, C, and having an associated address in said array;
   (b) electrically connecting each said capacitor to at least one detector circuit, said detector circuit including a substantially constant load impedance, R, connected in series with said capacitor, means for providing a voltage input, V, of known wave form to said detector circuit, means for measuring an instantaneous sample voltage, v, across a circuit element selected from the load impedance or the capacitor being measured after a known time interval T has elapsed, said sampling moment being in a predetermined fixed phase relationship to the input voltage V and means for precisely controlling said time interval T;
   (c) sequentially sampling the value of the capacitor at each address in said array by coupling the capacitor to a said detector circuit, applying the voltage input V in a predetermined sampling order to each capacitor in said array, and measuring the sample voltage, v, after said time interval T;
   (d) providing a processed numerical resultant for each sampled value of each capacitor in said array, said processed numerical resultant being representative of a measured variable per se or of a relational expression of a combination of variables, wherein said variables are selected from v, V, wave form, T and R; and
   (e) thereafter storing the processed numerical resultant for each address in said array.

23. A method as defined in claim 22, wherein said load impedance R exhibits dynamic changes in value or exhibits a non-linear impedance characteristic.

24. A method as defined in claim 22, wherein said load impedance R in said detector circuit contains a large capacitive characteristic which creates a capacitive voltage divider in said detector circuit which reduces the maximum possible value of the sample V in relation to the value of the capacitance, C.

25. A method as defined in claim 22, wherein said load impedance R has a relatively large capacitive characteristic which varies in relation to value of the capacitor, C.

26. A method as defined in claim 22, further comprising analyzing the stored resultants to identify differences, if any, between the capacitors in said array.

27. A method as defined in claim 22, further comprising repeating the sequential sampling, calculating and storing steps (c)–(e) at intervals of time and saving some of said resultants for each capacitor in said array.

28. A method as defined in claim 27, wherein said intervals of time are selected from regular intervals and variable intervals.

29. A method as defined in claim 27, further comprising analyzing the saved resultants with respect to time and identifying trends with respect to changes in the resultants for each capacitor in the array.

30. A method as defined in claim 29, wherein identified trends for at least one given address in said array are compared to the identified trends of changes in the resultants for at least one other address in said array.

31. A method as defined in claim 30, wherein the identified trends of a particular address are compared with trends of all other addresses within the array.

32. A method as defined in claim 30, wherein the identified trends of a particular address are compared with trends of each of the capacitors disposed in neighboring addresses in said array.

33. A method as defined in claim 30, wherein each capacitor at each address within said array further includes means for conditioning a signal associated with said capacitor and an output of each signal conditioning means is electrically connected to said detector circuit in said connecting step.

34. A method as defined in claim 33, wherein each capacitor output in said array is electrically connected to a single detector circuit, one capacitor at a time, in accordance with said predetermined sequential sampling order.

35. A method as defined in claim 34, further comprising repeating the sequential sampling, calculating and storing steps (c)–(e) at intervals of time and saving some of said resultants for each capacitor in said array.

36. A method as defined in claim 34, further comprising analyzing the saved resultants with respect to time and identifying trends with respect to changes in the resultants for each capacitor in the array.

37. A method as defined in claim 34, wherein identified trends for at least one given address in said array are compared to the identified trends of changes in the resultants for at least one other address in said array.

38. An apparatus for detecting and measuring small variations in the value of at least one capacitor having a generally predetermined value of capacitance, C, said apparatus comprising:
   a detector circuit including a substantially constant resistive load impedance, R, connected in series with said capacitor, means for providing a voltage input, V, having substantially a step wave form to said detector circuit, means for measuring an instantaneous sample voltage, v, across said load after a known time interval T has elapsed, said sampling moment being in a predetermined fixed phase relationship to the input voltage V and means for precisely controlling said time interval T;
   means for electrically connecting said capacitor being measured to said detector circuit in series with said load, whereby, upon connecting the capacitor to said detector circuit, applying said step voltage input, V, and measuring the instantaneous voltage, v, after elapsed time interval T, the value of the capacitor, C, may be determined in accordance with the formula:

$$C = \frac{T}{R} \times \frac{1}{\ln\left(\frac{V}{v}\right)}.$$

39. An apparatus as defined in claim 38, wherein said means for measuring the instantaneous voltage, v, comprises an n bit analog-to-digital (A/D) converter circuit having a full scale generally equal to V, wherein n is an integer greater than or equal to 4 and k is a converted digital sample value of the measured instantaneous voltage, v, and the value of C is determined in accordance with the formula:

$$C = \frac{T}{R} \times \frac{1}{\ln\left(\frac{2^n}{k}\right)}.$$

40. An apparatus as defined in claim 38, further including a digital control circuit for controlling the voltage input means and the A/D converter circuit for measuring the voltage, v, said digital control circuit comprising a microprocessor.

41. An apparatus as defined in claim 38, wherein said means for precisely controlling said time interval T comprises a precise and stable time base.

42. An apparatus as defined in claim 41, wherein said precision oscillator comprises a quartz crystal element.

43. An apparatus as defined in claim 41, wherein said precision oscillator comprises a ceramic resonator element.

44. An apparatus as defined in claim 41, wherein said means for providing an accurate timing reference has an accuracy of at least about 1000 ppm.

45. An apparatus for detecting variations in the value of capacitors as defined in claim 38, wherein said load impedance R exhibits dynamic changes in value or exhibits a non-linear impedance characteristic.

46. An apparatus for detecting variations in the value of capacitors as defined in claim 38, wherein said load impedance R in said detector circuit contains a large capacitive characteristic which creates a capacitive voltage divider in said detector circuit which reduces the maximum possible value of the sample V in relation to the value of the capacitance, C.

47. An apparatus for detecting variations in the value of capacitors as defined in claim 38, wherein said load impedance R has a relatively large capacitive characteristic which varies in relation to value of the capacitor, C.

48. An apparatus for detecting variations in the value of capacitors as defined in claim 38, further comprising the step of conditioning the signal being measured prior to said measuring step.

49. A method for detecting variations in the value of a capacitor in excess of an assigned variation amount and in the presence of electrical noise comprising:

(a) providing a capacitor to be measured having a generally predetermined reference value of capacitance, C and assigning a first value for said assigned variation amount;

(b) electrically connecting said capacitor to a detector circuit, said detector circuit including a substantially constant load impedance, R, connected in series with said capacitor, means for providing a voltage input, V, of known wave form to said detector circuit, means for measuring an instantaneous sample voltage, v, across a circuit element selected from the load impedance or the capacitor being measured after a known time interval T has elapsed, said sampling moment being in a predetermined fixed phase relationship to the input voltage V and means for precisely controlling said elapsed time interval T;

(c) applying said voltage input, V, to said detector circuit and measuring the sample voltage, v, across the circuit element after said elapsed time interval T;

(d) detecting variations in the value of said capacitor, in excess of an assigned variation amount, from the sample v, from said elapsed time interval T, and from said known wave form of the input voltage V;

(e) sampling the analog electrical input signal, v, and storing a processed numerical resultant representative of that sampled value of said analog input signal;

(f) comparing the difference between the stored numerical resultant obtained in step (e) and said reference value provided in step (a) with said first assigned variation amount;

(g) if the compared values from step (f) for two consecutive sampling steps exceeds the first assigned variation amount thereby identifying that the signal is varying in excess of the assigned variation amount;

(h) thereafter, reducing the value of said first assigned variation amount to a smaller second assigned variation amount;

(i) continuing said comparing steps until two consecutive comparisons for two consecutive sampling steps are greater than said second assigned variation amount and thereby identifying that said analog signal has returned to its normal reference value; and (j) thereafter, increasing the value of said second assigned variation amount to said first assigned variation amount.

50. A method for detecting variations in value of a plurality of capacitors arranged in an array in excess of an assigned variation amount and in the presence of electrical noise, said method comprising:

(a) providing an array of capacitors to be evaluated, each capacitor in said array having a generally predetermined reference value of capacitance, C, and having an associated address in said array and assigning a first value for said assigned variation amount;

(b) electrically connecting each said capacitor to at least one detector circuit, said detector circuit including a substantially constant load impedance, R, connected in series with said capacitor, means for providing a voltage input, V, of known wave form to said detector circuit, means for measuring an instantaneous sample voltage, v, across a circuit element selected from the load impedance or the capacitor being measured after a known time interval T has elapsed, said sampling moment being in a predetermined fixed phase relationship to the input voltage V and means for precisely controlling said time interval T;

(c) sequentially sampling the value of the capacitor at each address in said array by coupling the capacitor to a said detector circuit, applying the voltage input V in a predetermined sampling order to each capacitor in said array, and measuring the sample voltage, v, after said time interval T;

(d) providing a processed numerical resultant for each sampled value of each capacitor in said array, said processed numerical resultant being representative of a measured variable per se or of a relational expression of a combination of variables, wherein said variables are selected from v, V, wave form, T and R; and (e) thereafter storing the processed numerical resultant for each address in said array (f) comparing the difference between the stored numerical resultant obtained in step (e) and the said reference value provided in step (a) with said first assigned variation amount;

(g) if the compared values from step (f) for two consecutive sampling steps exceeds the first assigned variation amount thereby identifying that the signal is varying in excess of the assigned variation amount;

(h) thereafter, reducing the value of said first assigned variation amount to a smaller second assigned variation amount;

(i) continuing said comparing steps until two consecutive comparisons for two consecutive sampling steps are greater than said second assigned variation amount and thereby identifying that said analog signal has returned to its normal reference value; and (j) thereafter, increasing the value of said second assigned variation amount to said first assigned variation amount.

* * * * *